United States Patent [19]

Kani et al.

[11] Patent Number: 5,355,132

[45] Date of Patent: Oct. 11, 1994

[54] METHOD FOR TRANSMITTING DIGITAL DATA

[75] Inventors: Tetsuo Kani; Yasuo Seki, both of Kanagawa, Japan

[73] Assignee: Sony Corporation, Tokyo, Japan

[21] Appl. No.: 960,260

[22] Filed: Oct. 13, 1992

Related U.S. Application Data

[63] Continuation of Ser. No. 288,430, Dec. 22, 1988, abandoned.

[30] Foreign Application Priority Data

Dec. 29, 1987 [JP] Japan ................................. 62-335304
Jan. 22, 1988 [JP] Japan ................................. 63-12252

[51] Int. Cl.⁵ ............................................. H03M 7/00
[52] U.S. Cl. ........................................ 341/55; 360/40
[58] Field of Search .................. 360/32, 48, 53, 14.3, 360/40, 49; 370/85.13, 105, 105.1; 341/50, 55, 94, 95

[56] References Cited

U.S. PATENT DOCUMENTS

| | | | |
|---|---|---|---|
| 4,215,335 | 7/1980 | Doi et al. ............................. | 371/69 |
| 4,368,988 | 1/1983 | Tahara et al. ....................... | 360/32 |
| 4,394,762 | 7/1983 | Nabeshima ......................... | 360/53 |
| 4,466,029 | 8/1984 | Tanaka ................................. | 360/13 |
| 4,553,206 | 11/1985 | Smutek et al. ..................... | 364/300 |
| 4,604,657 | 8/1986 | Fukami et al. ..................... | 360/14.3 |
| 4,637,023 | 1/1987 | Lounsbury et al. ................ | 360/53 |
| 4,652,942 | 3/1987 | Eto ...................................... | 360/32 |
| 4,698,811 | 10/1987 | Eto et al. ............................. | 371/38 |
| 4,730,223 | 3/1988 | Ikeda et al. ......................... | 360/40 |
| 4,873,588 | 10/1989 | Hiramatsu ........................... | 360/47 |
| 4,905,100 | 2/1990 | Endo et al. ......................... | 360/48 |
| 4,965,576 | 10/1990 | Watanabe ............................ | 341/94 |

FOREIGN PATENT DOCUMENTS

| | | |
|---|---|---|
| 0133790 | 8/1985 | European Pat. Off. . |
| 0156154 | 10/1985 | European Pat. Off. . |
| 62-239487 | 10/1987 | Japan . |
| 2060227 | 4/1981 | United Kingdom . |
| 2081957 | 2/1982 | United Kingdom . |

OTHER PUBLICATIONS

Weisser, et al. "Description Of A New Format For Digital Audio-Tape Recording With Stationary Heads", France, pp. 1–13.

Primary Examiner—Howard L. Williams
Attorney, Agent, or Firm—Hill, Steadman & Simpson

[57] ABSTRACT

In a method for recording and/or reproducing digital data, such as digital audio signals recorded simultaneously with video signals, dividing sampling data composed of a plurality of bits into higher order bits and lower order bits, constituting error correction coding blocks by only the higher and lower order bits of the sampling data of a plurality of samples respectively, thereby making it possible to easily realize adaptive error checking in the course of the block-by-block error checking in association with, for example, data criticality.

A sync word and a block address are affixed to the error correction coding block constituted in that manner. Since one block address is formed using the address data of two or more blocks, a broader address space can be obtained even when the bit number of the address area of each block is few. At least one flag bit(s) are provided in each sync word to use said flag bits in the blocks bearing specified block addresses as edit flags to set the edit flags in association with each edit point of digital signals, thereby facilitating discrimination of the editing points to reduce the rate of data discarding.

5 Claims, 8 Drawing Sheets

FIG. 7

| BLOCK ADDRESS | B3 | B2 | B1 | B0 | FLAG |
|---|---|---|---|---|---|
| 0 | (A3) 0 | (A2) 0 | (A1) 0 | 0 | EMPHASIS |
| 1 | (A6) 0 | (A5) 0 | (A4) 0 | 1 | EDIT END POINT |
| 2 | 0 | 0 | 1 | 0 | |
| 3 | 0 | 0 | 0 | 1 | EDIT START POINT |
| 4 | 0 | 1 | 0 | 0 | |
| 5 | 0 | 0 | 0 | 1 | |
| 6 | 0 | 1 | 1 | 0 | (EDIT END POINT) |
| 7 | 0 | 0 | 0 | 1 | |
| 8 | 1 | 0 | 0 | 0 | (EDIT START POINT) |
| 9 | 0 | 0 | 0 | 1 | |
| 10 | 1 | 0 | 1 | 0 | |
| 11 | 0 | 0 | 0 | 1 | |
| 12 | 1 | 1 | 0 | 0 | |
| 13 | 0 | 0 | 0 | 1 | |
| 14 | 1 | 1 | 1 | 0 | |
| 15 | 0 | 0 | 0 | 1 | |
| 16 | 0 | 0 | 0 | 0 | EMPHASIS |
| 17 | 0 | 0 | 1 | 1 | EDIT END POINT |
| 18 | 0 | 0 | 1 | 0 | |
| 19 | 0 | 0 | 1 | 1 | EDIT START POINT |
| ≈ | ≈ | | | ≈ | ≈ |
| 248 | 0 | 0 | 0 | 0 | |
| 249 | 0 | 0 | 0 | 0 | |

METHOD FOR TRANSMITTING DIGITAL DATA

This is a continuation of application Ser. No. 288,430, filed Dec. 22, 1988 now abandoned.

BACKGROUND OF THE INVENTION

This invention relates to a method for recording and reproducing digital data. More particularly, it relates to a method for transmitting digital data, such as digital audio signals recorded simultaneously with video signals.

As the method for recording digital audio signals, there is so far known a method shown in the Japanese Patent Applications laid open Nos. 36410/1982 and 104714/1984 filed in the name of the present Assignee, wherein digital signals sampled at the sampling frequencies of 32 kHz, 44.1 kHz and 48 kHz so that each sample is formed by 16 bits, are formed on a plurality of digital audio tracks, two analog audio tracks and each one time code track and control track, these tracks extending along the tape running direction.

However, since the consumer appliances also make use of the similar sampling frequencies, with each sample including 16 bits, there is practically no difference in the performance between these consumer appliances and professional appliances.

These professional appliances are used in general for forming software programs for these consumer appliances, as an example. In the course of the program formation, it becomes necessary to edit recorded audio signals. However, the audio signals are usually deteriorated in sound quality during such editing. In this consideration, there is a demand in the professional appliances for expanding each sample data from 16 bits to 20 bits, in order to comply with future improvement in the performance of AD converters and to cope with deterioration in the sound quality at the time of editing. Nowadays, devices such as AD converters adapted in this manner have become more and more available.

In digital video tape recorders (VTRs) adapted to record and reproduce digital video signals, audio signals are recorded in the digital form. The Japanese Patent Application laid open No. 199179/1987, assigned to the present assignee, disclosed a VTR in which television signals are recorded in the digital form. Although this prior art technique shows an example of three kinds of audio signal recording modes, it is also contemplated to make digital recording of audio signals by stationary heads, in addition to these modes, in consideration that the tape running speed of the VTR adapted to record television signals is relatively high and amounts approximately to 805 mm/sec. In such case, it is similarly preferred that each sample data be expanded from 16 bits to 20 bits.

For implementing such bit expansion, since it is preferred not to abandon the basic 16-bit pattern, the 20 bits of one sample data can be divided into, for example, 16 bits and 4 bits, in order to assure compatibility with the original 16-bit data format.

The Japanese Patent Application laid open No. 30108/1982, similarly assigned to the present Assignee, discloses a technique of expanding the 14-bit-per-word data format for audio PCM recording by the consumer VTR into a 14-bit-per-word data format. In this technique, when the data format in which six sample data words having a word length of 14 bits, P and Q parities and CRCC (Cyclic Redundancy Check Code) of 16 bits are arranged in one horizontal period (1H) of the standard television signals of the NTSC system, is to be expanded to 16-bit words, the 14 bits of each of the seven words of the sample data and the P parity are arrayed at the original word positions, while the remaining two bits of these seven words are arrayed in the same sequence to form a 14-bit data which are arrayed at the word position of the Q-parity.

When the 14 bit portion and the remaining two bit portion are collectively arrayed in one block corresponding to each horizontal period, problems are presented in that error correction cannot be made in association with criticality of these portions.

OBJECTS AND SUMMARY OF THE INVENTION

It is therefore an object of the present invention to provide a novel method for transmitting digital data which is free from the above described drawbacks of the prior art.

It is a principal object of the present invention to provide a method for transmitting digital data making it readily possible to perform adaptive error checking in the course of the block-by-block error checking in association with, for example, data criticality.

It is another object of the present invention to provide a method for transmitting digital data making it possible to obtain a block address of a large number of bits despite the small number of address bits per block.

It is still another object of the present invention to provide a method for transmitting digital data making it readily possible to make a decision of whether a given point is an edit point for digital data.

According to the present invention, there is provided a method for transmitting digital data comprising the steps of dividing respective digital data each composed of a plurality of bits into respective higher order bits and respective lower order bit(s), constituting first blocks each including a first predetermined number of words each comprised of a second predetermined number of said higher order bits of said respective digital data, constituting second blocks each including said first predetermined number of words each comprised of a third predetermined number of said lower order bits of said respective digital data, encoding error detection or correction code with respect to said words of said first and second blocks so as to generate redundant data, and transmitting said digital data and said redundant data for said error detection or correction code.

According to the present invention, there is also provided a method for transmitting digital data comprising the steps of constituting respective blocks each including a plurality of digital data, generating respective address data which sequentially change, dividing said respective address data into two or more address data units, providing each of said respective address data units with each of respective blocks each at a predetermined position, and transmitting said respective blocks with said respective address units.

According to the present invention, there is also provided a method for transmitting digital data comprising the steps of constituting respective blocks each including a plurality of digital data and block address data, editing said digital data at predetermined numbered block(s), and transmitting said respective blocks with said respective flag data.

BRIEF DESCRIPTION OF THE DRAWINGS

FIG. 7 is a diagrammatic view showing the construction of block addresses a flag in the sync word shown in FIG. 6.

DETAILED DESCRIPTION OF THE PREFERRED EMBODIMENTS

Figure 1:
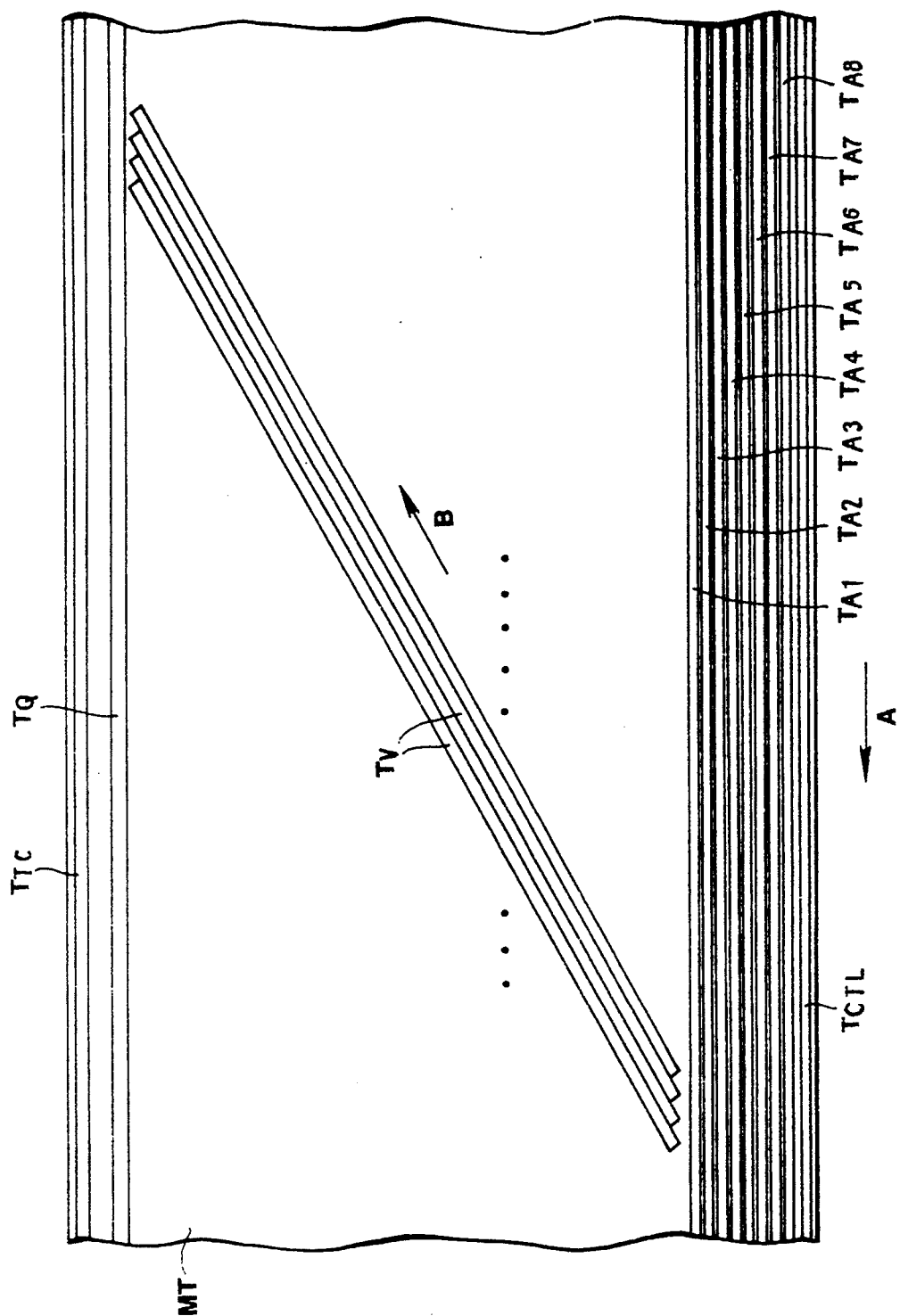
FIG. 1 is a diagrammatic view showing an example of a pattern of recording tracks on a magnetic tape formed in accordance with the method for transmitting digital data of the present invention.

Referring to the drawings, the method for transmitting digital data according to a preferred embodiment of the present invention will be explained in detail.

Figure 2:
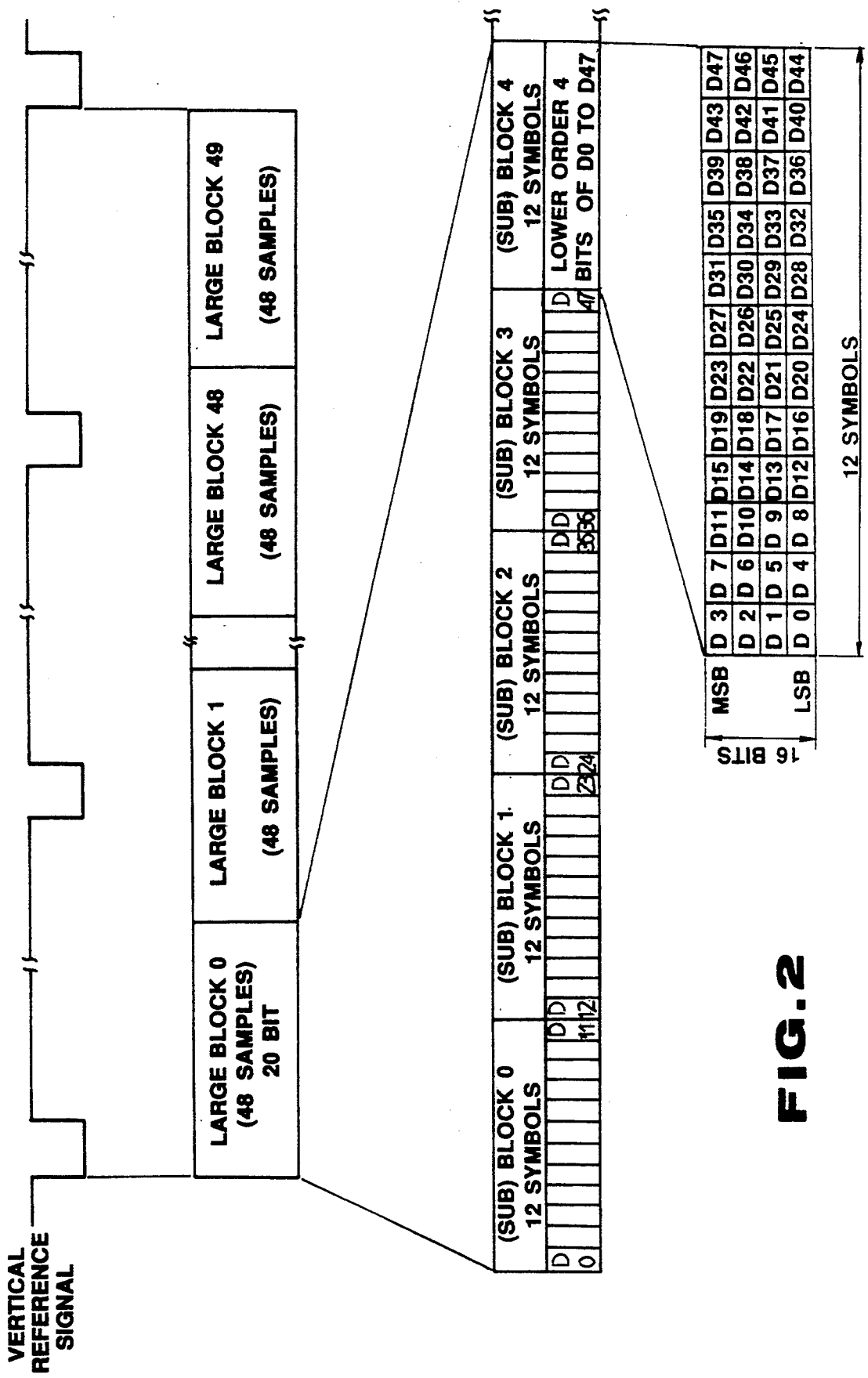
FIG. 2 is a diagrammatic view showing the data array in a digital audio data block according to an embodiment of the method for transmitting the digital data of the present invention.

FIG. 1 shows an example of the recording pattern for video and audio tracks recorded on a magnetic tape MT. The digital video signals are recorded by a rotatory magnetic head in the form of a number of video track Tv extending parallel to one another and obliquely with respect to the longitudinal direction of the magnetic tape MT. Two sets of magnetic heads composed of four magnetic heads grouped together are mounted on a rotary drum at an angle of 180° from each other. The magnetic tape is guided along the direction shown by the arrow mark A as it is wrapped about the drum at a wrap angle of about 330°. With the drum rotating at 7200 rpm or 120 c/s, 16 video tracks Tv are recorded and formed during each field period for two drum revolutions. The arrow mark B in the drawing indicates the direction in which the rotatory video head proceeds relative to the magnetic tape MT. Also, 8-channel digital audio signals are recorded by a stationary magnetic head on eight tracks $T_{A1}$ to $T_{A8}$ formed on the margin of the magnetic tape MT parallel to one another and along the tape proceeding direction as indicated by the arrow mark A. There are also provided a time code track $T_{TC}$, a control track $T_{CTL}$ and a cue-track $T_Q$ along the tape advancing direction shown by the arrow mark A on the magnetic tape MT. Field pulses are recorded on the control track $T_{CTL}$. As shown in FIG. 2, 50 large blocks of the digital audio data are allotted to three field periods or three vertical periods of the television signals, with each large block including 48 samples each having a word length of 20 bits. Thus, 2400 samples are included in three fields so that each field is formed by 800 samples. In this case, the field frequency of the television signals is 60 Hz and the sampling frequency of the audio signals is 48 kHz. Each large block is formed by five blocks or sub-blocks, with each sub-block being formed by 12 symbols of data each composed of 16 bits. With the five large blocks of #0 to #4 and the data in the 48 samples of D0 to D47, the data of the 16 upper-order bits of the sample data D0 to D47 are sequentially arrayed in the four blocks #0 to #3 from the leading end, while the 4 lower-order bits of the sample data D0 to D47 are sequentially arrayed in the last block #4. The lower 4 bits of 4×12=48 samples are allocated to the 12 symbols of the last block #4 so that the four lower-order bits of the sample data are sequentially allocated from the least significant bit (LSB) to the most significant bit (MSB) of the 16 bits of each symbol. In this manner, the sample data having a word length of 20 bits are divided into the 16 upper-order bits of each of the 48 samples, allocated to each of the 48 symbols of each of the four blocks of the large block unit of 60 symbols, and the 4 lower-order bits of each of the 48 samples are allocated to the 12 symbols of the remaining one block. Each symbol of the above described data format is subjected to error correction coding, with the above described one block as the delay unit for interleaving.

Figure 3:
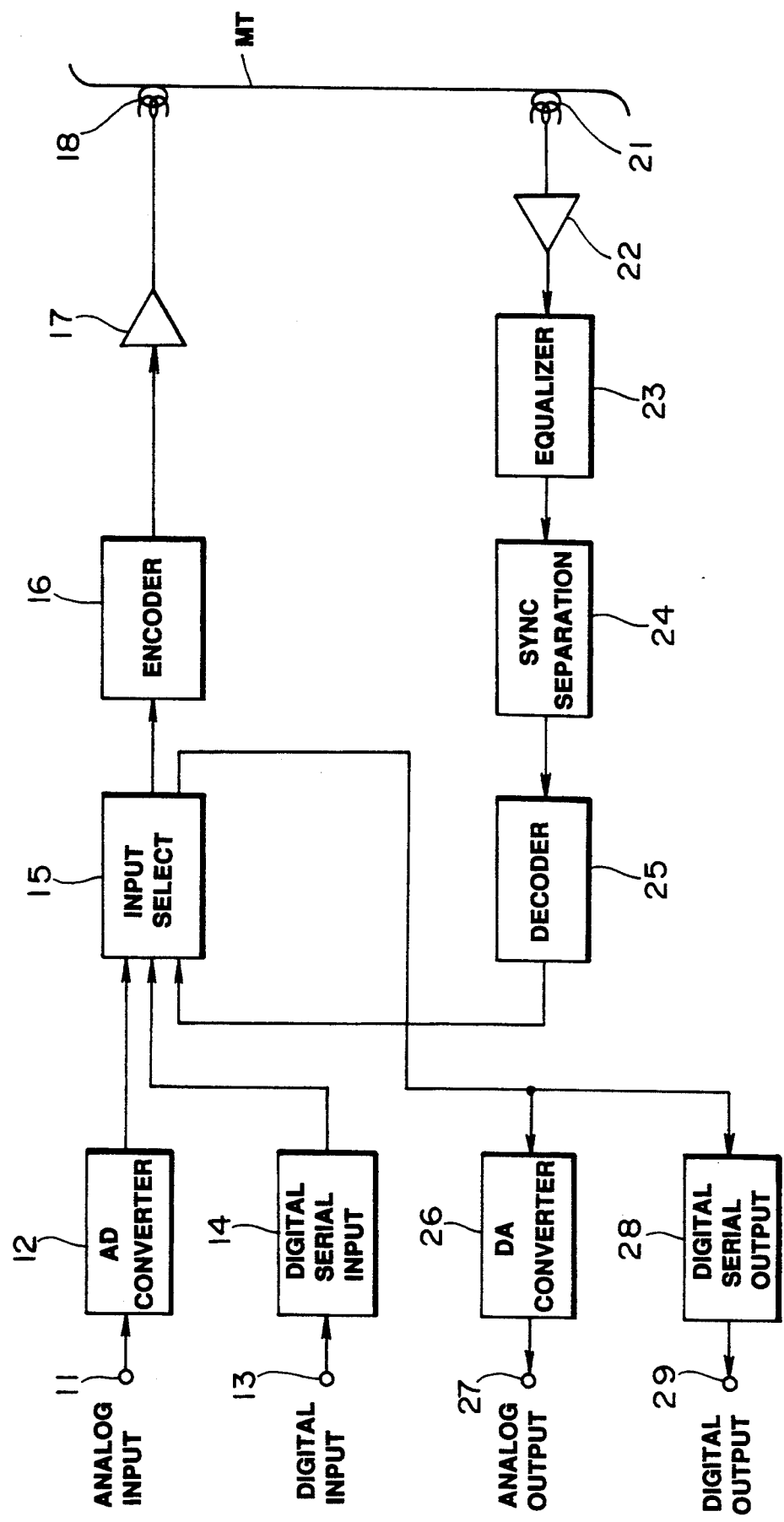
FIG. 3 is a block diagram showing an example of a recording/reproducing system of digital VTR audio signals to which is applied the method for transmitting digital data according to an embodiment of the present invention.

Referring to FIG. 3, showing a 1-channel audio signal recording and reproducing system for the digital VTR, analog audio signals are transmitted to an AD converter 12 via an input terminal 11, while digital audio signals are transmitted to a digital serial input circuit 14 via an input terminal 13. The output signals from the AD converter 12 and the digital serial input circuit 14 are coupled to an input select circuit 15 performing an editing function, such as mixing. The digital audio signals from the input select circuit 15 are subjected (at a recording encoder 16) to error correction coding where sync and address signals are affixed to the signals and the resulting signals are transmitted, after conversion into recording signals of a predetermined modulation system, to a stationary recording head 18 via recording amplifier 17, so as to be recorded on longitudinal tracks of the magnetic tape MT. The digital audio signals recorded on the magnetic tape MT are reproduced by a stationary reproducing head 21 and transmitted via a reproducing amplifier 22 and an equalizer 23 to a sync separating circuit 24 for extraction of sync signals or clock components. The resulting signals are subjected at a decoder 25 to a decoding operation including demodulation and error correction so as to be transmitted to the input select circuit 15. The digital audio signals from the input select circuit 15 are taken out via a DA converter 26 at an output terminal 27 and also via a digital serial output circuit 28 at an output terminal 29.

In the input select circuit 15, reproduced signals are switched to signals coupled to input terminals 11 and 13 or vice versa by way of an edit operation.

Figure 4:
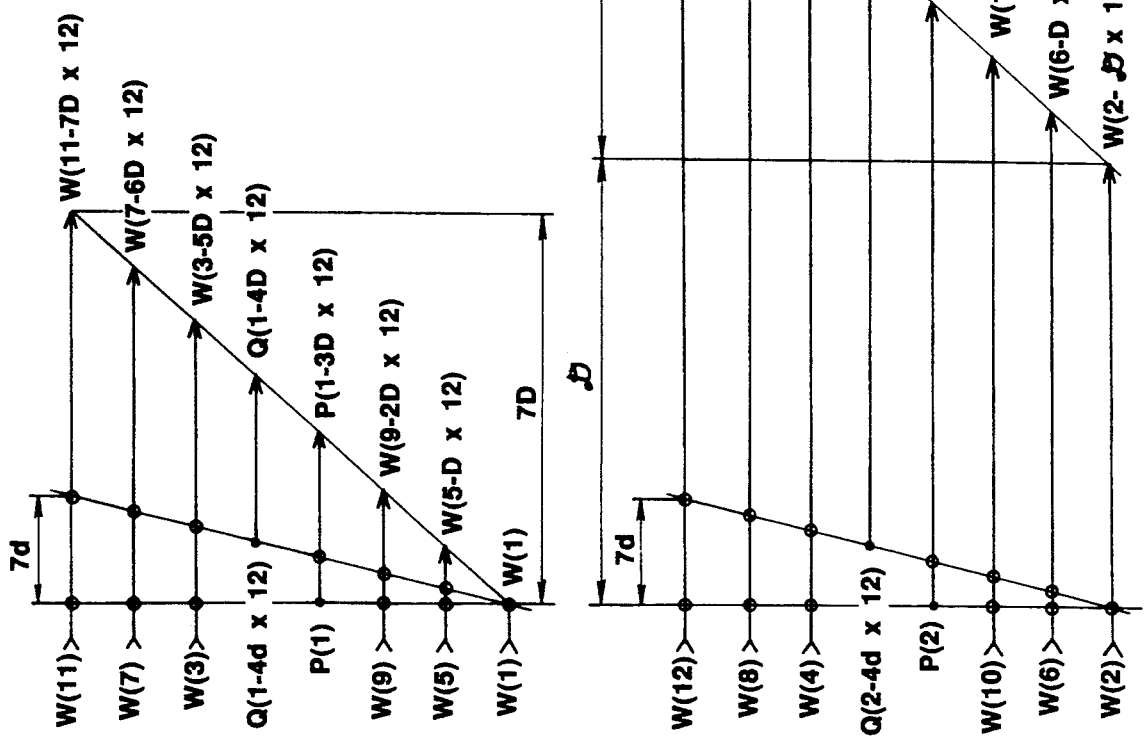
FIG. 4 is a diagrammatic view for illustrating the error correction coding employed in the method for transmitting digital data according to an embodiment of the present invention.

FIG. 4 shows the error correction coding at the encoder and, above all, the manner in which the 12 symbols of the one block or sub-block are interleaved.

In this figure, when continuous plural symbols are arrayed in order, with the 60 (16 bits) symbols of one large block unit of five blocks shown in FIG. 2 (or the 48 symbols in terms of the 20-bit length words) as a period of repetition, the 12 symbols for one subblock are designated the words W(1) to W(12) in order. These 12 symbols are distributed into odd-numbered words W(1), W(3), . . . , W(11) and even-numbered words W(2), W(4), . . . , W(12) and first parity words $P_1$ and $P_2$ are generated and allocated to each of the odd-number and even-number series. The data of the odd-number series and the even-number series are subjected to a predetermined delay and interleaving and then the second parity words $Q_1$ and $Q_2$ are generated and allocated to each of the so-processed series of data. These data are subjected to a predetermined delay while the delaying and interleaving is performed between the odd and even numbered data series to produce the error correction coded data series. The output data from the error correction coding process are formed of eight symbols for each of the odd and even numbered data series, with each block containing 16 symbols, since P and Q parities are affixed to each series. As a concrete example of these output data, the odd-numbered series data are composed of the following sequence of words:

W(1)
W(5 − D × 12)
W(9 − 2D × 12)
P(1 − 3D × 12)
Q(1 − 4D × 12)
W(3 − 5D × 12)
W(7 − 6D × 12)
W(11 − 7D × 12)

The even-numbered series data are composed of the following sequence of words:

W(2 − D × 12)
W(6 − D × 12 − D × 12)
W(10 − 2D × 12 − D × 12)
P(2 − 3D × 12 − D × 12)
Q(2 − 4D × 12 − D × 12)
W(4 − 5D × 12 − D × 12)
W(8 − 6D × 12 − D × 12)
W(12 − 7D × 12 − D × 12)

In the above formulas, D and D are defined as follows:

D = 17 blocks = 17 × 12 symbols
D = 9D = 9 × 17 × 12 symbols

In FIG. 4, d denotes two blocks or 24 symbols.

Figure 5:
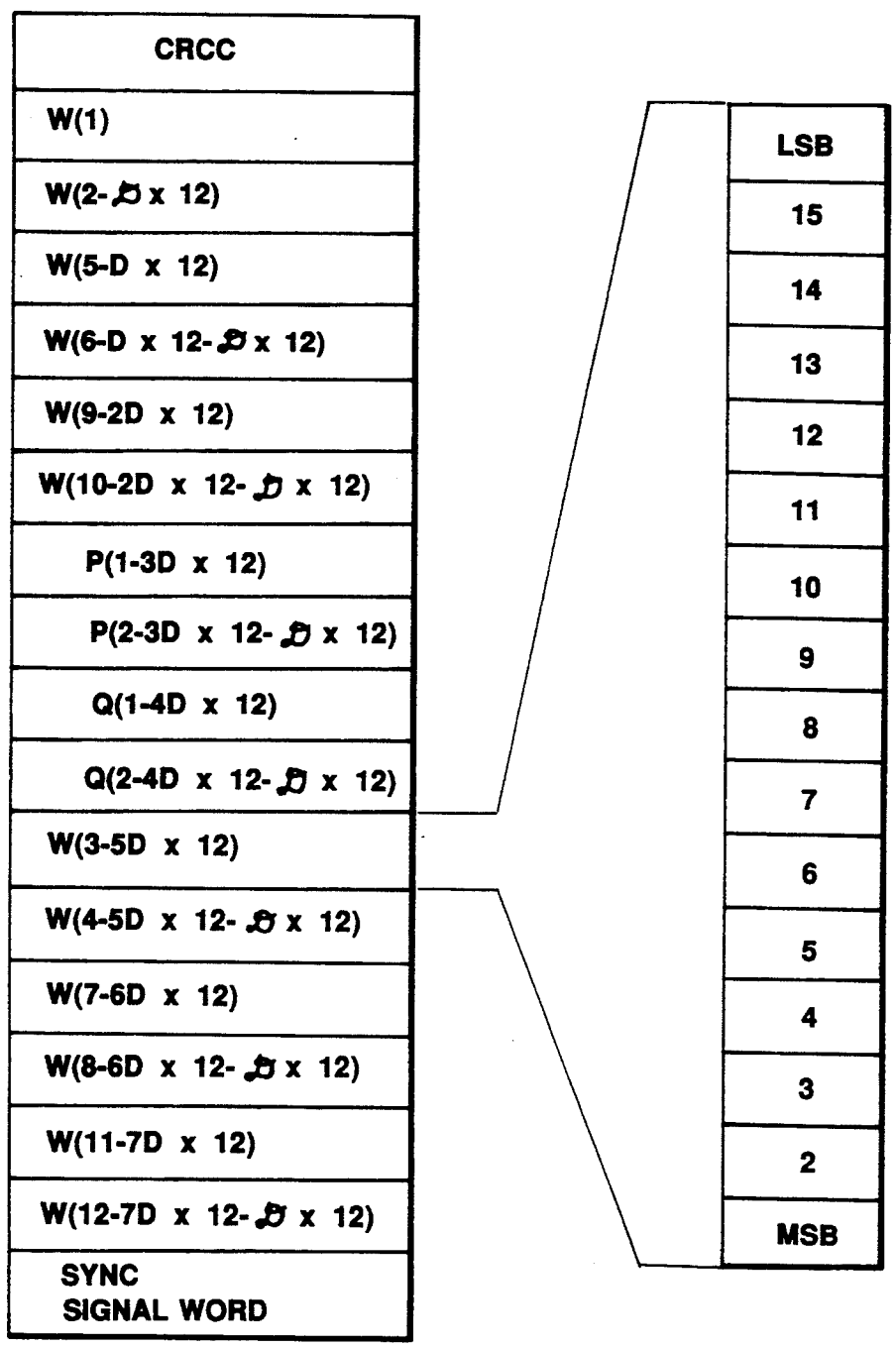
FIG. 5 is a diagrammatic view showing an error correction coding block constituted by the error correction coding shown in FIG. 4.

In recording output data (16 symbols) corresponding to one block following the above described error correction coding, a recording block shown in FIG. 5 is formed. Thus a sync word composed of 16 bits is placed at the leading end of a recording block, followed alternately by even-numbered data and odd-numbered data and finally by an error correction code CRCC. At the four mid symbols of the block, the P and Q parities are arrayed. The 16 symbols of the data and parity portions are arrayed in the following order:

W(12 − 7D × 12 − D × 12)
W(11 − 7D × 12)
W(8 − 6D × 12 − D × 12)
W(7 − 6D × 12)
W(4 − 5D × 12 − D × 12)
W(3 − 5D × 12)
Q(2 − 4D × 12 − D × 12)
Q(1 − 4D × 12)
P(2 − 3D × 12 − D × 12)
P(1 − 3D × 12)
W(10 − 2D × 12 − D × 12)
W(9 − 2D × 12)
W(6 − D × 12 − D × 12)
W(5 − D × 12)
W(2 − D × 12)
W(1)

Figure 6:
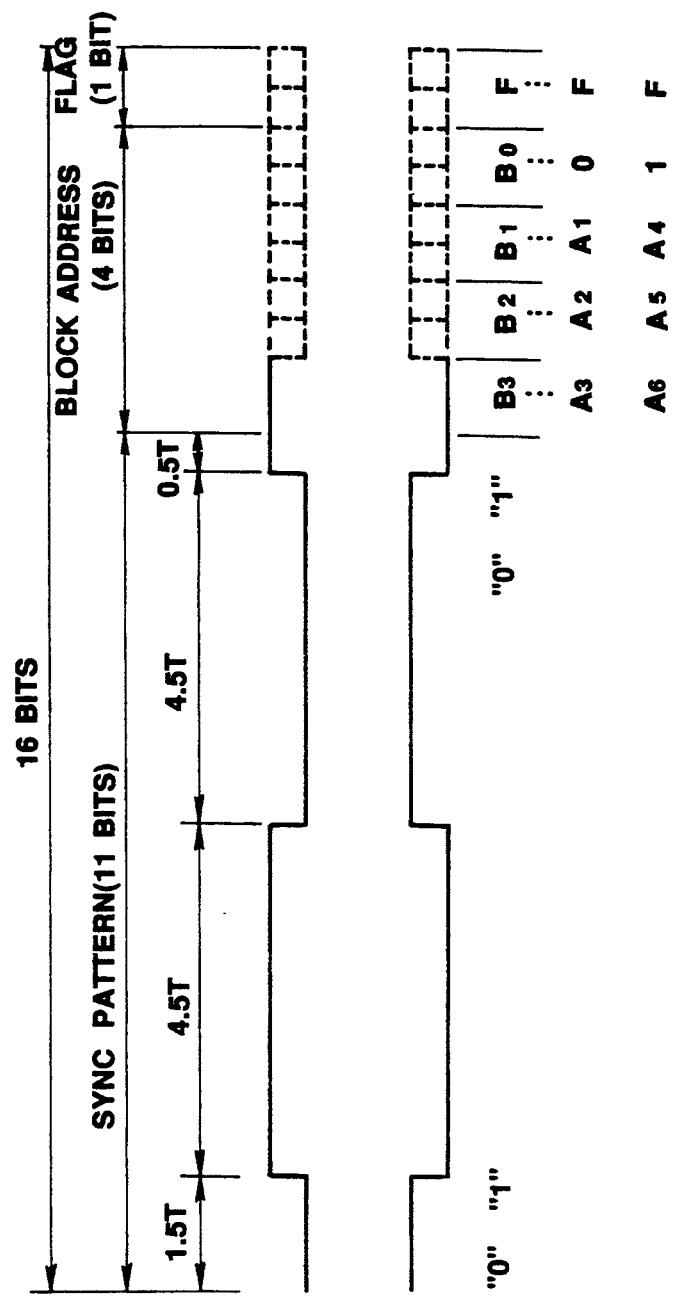
FIG. 6 is a diagrammatic view showing an example of a sync word affixed to the error correction coding block shown in FIG. 5.

FIG. 6 shows the array of a 16-bit sync signal word placed at the leading end of the recording block. The forward side 11 bits of the 16-bit sync signal word of FIG. 6 represent a sync pattern, whereas the rear side 5 bits represent a block address of 4 bits and a flag of one bit. In the above sync pattern, with the bit period T, transition or inversion occurs sequentially at each of the positions of 1.5T, 6.0T and 10.5T, as viewed from the leading side. It is noted that the data words W and the parities P and Q are modulated by what is called a HDM-1 modulation system, as an example. According to this modulation system, the interval between the transitions ranges from the shortest interval of 1.5T to the longest interval of 4.5, with the longest transition interval of 4.5T not occurring in succession. However, in the above sync pattern, the transition intervals of 4.5T occur in succession. Hence, the above described sync pattern is the so-called out-of-rule pattern, which violates the rule of the above described predetermined modulation system, so that it becomes possible to demarcate the sync signal word and the data word from each other.

When recording audio PCM signals in the digital VTR by the above described stationary head, the video signal recording area on the magnetic tape occupies a larger area, so that limitations are imposed on the number of tracks, other than the video signal tracks, formed along the tape running direction. It is therefore difficult to provide a track dedicated to addresses. Although it becomes necessary to add the address to the track intended for digital audio signals, allocation of an increased number of bits to addresses results in increased redundancy. Then the four block address bits (B3, B2, B1 and B0 in the order of transmission) of an even-numbered address block and those of an odd-numbered address block form one significant address. Such construction is adopted in consideration that 8-bit block addresses are necessitated to discriminate 250 subblocks (50 large blocks) forming a period of repetition in the data format of FIG. 2, whereas the address area in the above sync signal word is formed by four bits. With the eight block address bits of $A_0$, $A_1$, . . . , $A_7$ looking in order from LSB, $A_0(=0)$, $A_1$, $A_2$ and $A_3$ are allocated to bits $B_0$ to $B_3$ of the even-numbered address blocks, while $A_0(=1)$, $A_4$, $A_5$ and $A_6$ are allocated to bits $B_0$ to $B_3$ of the odd-numbered address blocks. The last one bit is used as the flag F for indicating the emphasis on/off, edit start point and edit end point etc. With 16 blocks as one period, it becomes possible to indicate 16 different kinds of information.

FIG. 7 shows a practical example of the four block address bits $B_0$ to $B_3$ and the flag bit F. In this figure, in order to indicate the block addresses #0 to #249 of the 250 blocks forming a period of repetition, the aforementioned four bits $B_0$ to $B_3$ are used across two neighboring blocks. With the least significant bit $A_0$ of the block address bits necessarily allocated to the least significant bit $B_0$, the six block address bits $A_1$ to $A_6$ can be indicated by three block address bits $B_1$ to $B_3$ of two continuous blocks. although only 00H to 7FH in the hexadecimal notation system or 0 to 127 in the decimal notation system can be indicated by these seven bits $A_0$ to $A_6$, since the period of repetition is the 250 blocks (bearing the addresses #0 to #249), restoration can be made easily at the time of reproduction even when the most significant bit $A_7$ is omitted. That is, when the address #0 to #249 in the decimal notation system are indicated by seven bits, 0 to 127 is 00H to 7FH in the hexadecimal notation system and 128 et seq. is indicated by 00H et seq. in the hexadecimal notation system. When the block address reaches 249 and returns to 0, the change is from 79H to 00H in the hexadecimal notation system and thus can be demarcated from the change from 7FH to 00H corresponding to the change from 127 to 128 in the decimal notation system. Hence the most significant bit A7 can be identified in dependence upon whether the hexadecimal number directly before 00H of the block address is 7FH or 79H.

When reproducing the recorded digital audio signals, the aforementioned sync pattern of the sync signal word is detected by the sync separating circuit 24 of FIG. 3 to identify the leading position of the recording block. Then, each word in the block is subjected to deinterleaving or error correction decoding by the decoder 25 to restore the original data array as shown in FIG. 2. With the data array thus restored, error checking in performed for each block by the P parity. When there exist more than a predetermined number of uncorrectable errors, the reproduced data are assumed to be lacking in fidelity so that muting, for example, is carried out. In making the error checking, the last sub-block #4 in one large block of FIG. 2 need not be checked for error since the sub-block #4 in one large block in FIG. 2 is formed by the four lower order bits of the 20-bit data and any error caused in these lower order bits can be safely disregarded. It is possible in this manner to improve the durability of the audio data in their entirety with respect to errors and to reduce the rate of block error generation substantially to four fifths. In other words, when the rate of block error generation is n %, for example, the actual rate of error generation is reduced to 4n/5%.

The method of discriminating the edit points with the use of the flag bits provided in the sync word is hereafter explained.

When the above described stationary head type digital audio signal recording system is applied to audio recording in VTR, should the digital audio signals be edited after head tracking adjustment with respect to video tracks, it may occur that the data blocks become discontinuous at the edit points. Thus it may occur that the address value from an inside block address counter performing a flywheel type count operation is not coincident with the reproduced block address. This is usually regarded as having been caused by overlooking the error detection by CRCC and the corresponding block data are discarded. However, should non-coincidence occur twice on end, it is regarded as having been caused by block shifting or deviation and the data reproduction is re-started after making a correction of the inside block address counter. Thus, the non-coincidence between the value of the reproduced block address and the value from the inside counter may be ascribable to reproduction of a mistaken block address caused by overlooking the error detection by CRCC and to adverse block continuity at the edit point. However, these two possible causes of block address non-coincidence may be discerned from each other only after making a check of whether the non-coincidence has occurred twice on end.

For clearer identification of the edit point, identification signals for edit points can be recorded on the tape. However, it is not advisable to provide an additional track for the edit point identification signal or to vary the servo track signal frequency for tape travel control at the edit points.

Thus the above described flag bits are used for identification of the edit points. Referring to FIG. 7, the flag bits F of the second and the fourth of each 16 blocks are used as the edit end point flag and the edit start point flag, respectively, while the flag bit F of the first block is used as the emphasis flag. Thus the flag bits F of the blocks bearing the block addresses 1, 17, . . . are used as the edit end point flags, the flag bits F of the blocks bearing the block addresses 3, 19, . . . are used as the edit start point flags and the flag bits F of the blocks bearing the block addresses 0, 16, . . . are used as the emphasis flags.

The status of the blocks in the vicinity of the edit points following editing will be explained by referring to FIGS. 8 to 10 and in relation with the above described edit point flags.

Figure 8:
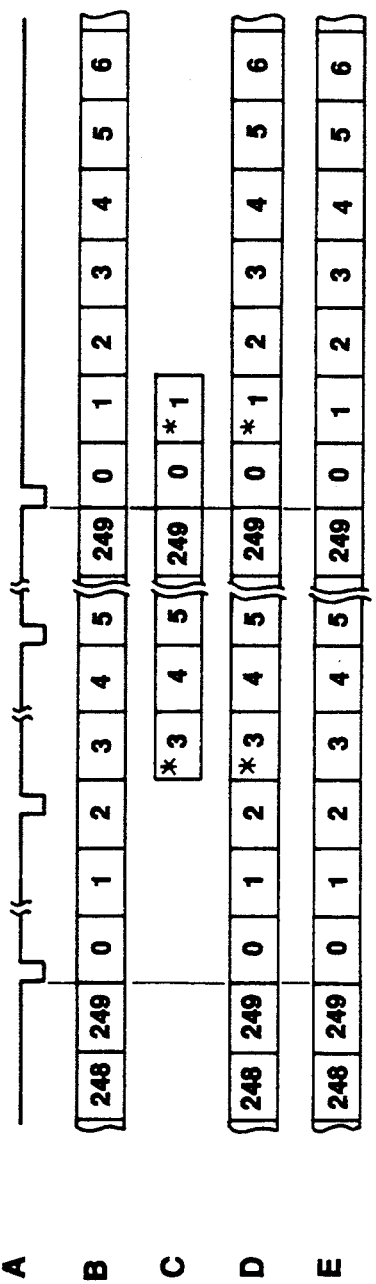
FIGS. 8 to 10 are diagrammatic views for illustrating the block status in the vicinity of the edit points when the audio signals are edited.

FIG. 8 shows the case wherein the edit record portion at the time of editing is optimally continuous with the record contents on the tape without position shifting of the blocks or sub-blocks. More precisely, at least three fields of the field reference signals for the video signals are shown at A, digital audio signals reproduced from the tape are shown at B, inserted record portions for editing are shown at C, digital audio signals reproduced from the tape after editing are shown at D and block addresses from the so-called flywheel counter are shown at E. In FIGS. 8B to D, the blocks of the digital audio signals are indicated by the above block addresses. In this figure, block address continuity is maintained at the insert portion shown at C in FIG. 8 and editing is performed without block position shifting.

However, when the so-called video tracking adjustment is made as described hereinafter, digital audio signals are reproduced with shift, for example, within the range of several blocks or sub-blocks, with respect to the video field reference signals. An example is shown in FIG. 9, wherein A to E in the figure correspond to A to E in FIG. 8, respectively.

Figure 9:
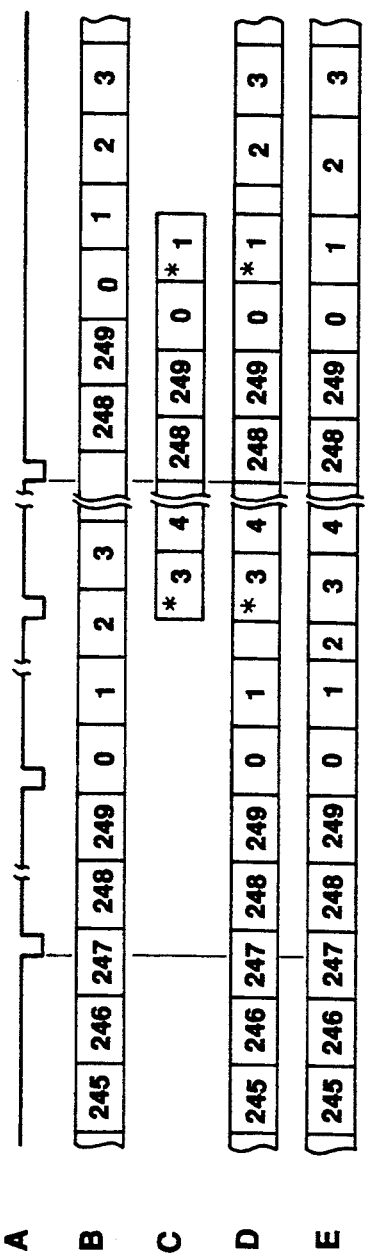

In FIG. 9B, since video tracking, adjustment has been made as described hereinafter, digital audio signals are reproduced with a delay of 2.4 blocks with reference to the field reference signals of FIG. 9A. On the other side, since the recording is made at the recording side at the block timing with respect to the above field reference signals, the record portion to be inserted by editing (FIG. 9C) can be delayed by two blocks from the block array of FIG. 8, even when the blocks of the reproduced signals are read out to bring the block addresses into coincidence. Therefore, the block array of the audio signals after the editing is as shown at D in FIG. 9 and block fragments of 0.6 and 0.4 blocks are produced ahead and back of the edit areas inserted into the original signals. However, since the so-called flywheel counter counts up the block fragments having the size of not less than 0.5 block, the address value of the edit start block shown at D in FIG. 9 coincides with the output address value from the flywheel counter shown at E in FIG. 9. Since the next block fragment of the edit end block is lesser in block size than 0.5 block, the flywheel counter does not count up, so that block address coincidence is achieved.

Figure 10:
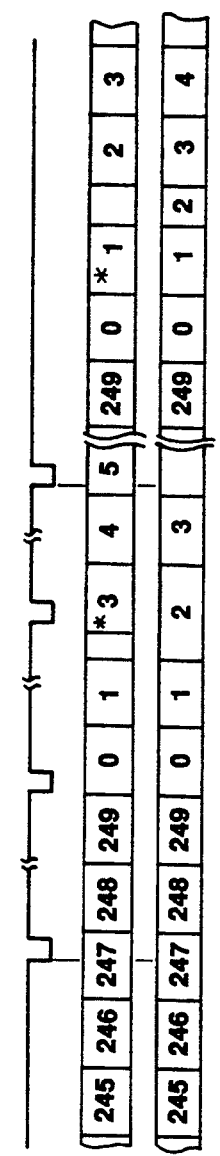

However, when the block continuity as shown in FIG. 9 is not obtained due to so-called wow flutter or mechanical inaccuracies, but the block fragment at the edit start point is lesser in block size than 0.5 block, as shown at D in FIG. 10, the address value of "3" of the edit start block and the output address value "2" from the flywheel counter shown at E in FIG. 10 are not coincident with each other. At least two blocks are necessitated before it can be discerned whether the non-coincidence has been caused by the overlooking the error detection by CRCC or by editing, with the data of these blocks being discarded.

In the present embodiment, edit flags are set at the edit start block having an address value of "3" and at the edit end block having an address value of "1", so that the above decision can be made quickly and the discarded data may be reduced to a minimum.

The symbols * at the upper left of the block address values in FIGS. 8 to 10 indicate that the edit flags are set. Thus the edit start point flag is set at the address "3" block while the edit end point flag is set at the address "1" block. During reproduction, these edit flags can be checked to decide whether the point is the point where editing has been made, thereby to reduce the number of errors at the edit points. For example, when the block address is recorded as two blocks, as in the present embodiment, two blocks are necessitated for obtaining the block addresses, so that four blocks are necessitated to perform the above described comparison with the flywheel counter, and the data during this time are discarded. In the present embodiment, if the point is the edit point, the operation of correcting the count value of the flywheel counter can be performed immediately, even when the reproduced block address is not coincident with the value from the flywheel counter, so that the number of the discarded data can be reduced to less than half.

In the present embodiment, the flag area for edit start point identification is provided in a block spaced by one block only from the block where the flag area for edit end point identification is provided, so that, when the edit start point and the edit end point co-exist in one and the same block, as a result of a plurality of times of editing operations, only that one block situated between the blocks where there are provided the associated flags, the second block in the present embodiment, becomes unstable. When the flags for identification of the edit start and end points are set in the even-numbered blocks afforded with the lower order block addresses, for example, the eight and sixth blocks shown within brackets in FIG. 7, it can be decided by the block addresses whether the point is the edit start point or the edit end point.

According to the method for transmitting digital data of the present invention, the bit number expansion from 16 to 20 bits for each word can be realized without affecting data format campatibility. On the other hand, for blocks consisting only of higher order bits and lower order bits, error checking may be performed with different checking levels or ranks, for example, error checking can be made positively for blocks consisting of higher order bits, with the error checking for the blocks consisting of lower order bits being not made, in dependence upon the criticality of the different blocks, thereby to elevate the tolerability for error occurrences.

The present invention is not limited to the case of bit number expansion from the 16 to 20 bits, as described hereinabove, but can be applied to the case of any other types of bit number expansion. The present invention is also not limited to the bit number expansion, but may be applied to the case of transmitting any prescribed bit data after division thereof into other desired higher order and low order bits.

According to the method for transmitting digital data of the present invention, since one address is formed using the address information of each of plural blocks, an address consisting of a large number of bits can be obtained even when the bit number of the address area of each block is small, so that a broader block address space can be realized easily.

The present invention can be applied not only to recording digital signals on the recording medium, but also to forming block address at the time of transmission of the digital signals in the block form.

According to the method for transmitting digital data of the present invention, the flags in the blocks bearing specified block addresses can be used as edit flags, which can be set as a function of editing of digital signals, so that, when the reproduced block address is not coincident with the address value from the so-called inside flywheel counter, the edit flag can be checked to decide whether the non-coincidence is caused by the overlooking the error detection by CRCC or by the block discontinuity at the edit points and hence data can be reproduced without being discarded as in the conventional practice.

It is to be noted that the present invention is not limited to the above embodiments. For example, the present invention can be applied not only to a format in which the block address is recorded across two neighboring blocks, but to a format in which block address is recorded on only one block or over three or more blocks. In addition, the present invention may be applied not only to the field of a digital VTR but to the field of customary fixed type digital audio tape recorder.

What is claimed is:

1. A method of processing digital data into a form of data which has plural blocks each having fewer bits than original source digital data comprising the steps of:
   dividing said original source digital data each composed of a plurality of bits into respective higher order bits and respective lower order bit(s);
   constituting first blocks each including a first predetermined number of words each comprised of a second predetermined number of said higher order bits of said respective digital data;
   constituting second blocks each including said first predetermined number of words each comprised of a third predetermined number of said lower order bits of said respective digital data;
   encoding error detection or correction code with respect to said words of said first and second blocks so as to generate redundant data;
   producing said digital data and said redundant data for said error correction or correction code in a sequence comprising a plurality of consecutive ones of said first blocks followed consecutively by at least one of said second blocks;
   providing, for each of said blocks, sequentially numbered address identifying data;
   dividing said respective address data to two or more sequences of address data units, one of which has duplicate identifying data;
   providing each of said respective address data units to said respective blocks each at a predetermined positions; and
   producing said sequence of said blocks with said blocks incorporating said respective address data units.

2. The method of processing digital data according to claim 1 further including the steps to recover the original source digital data comprising:

receiving said digital data and said redundant data for said transmitted error detection or correction code;

decoding error detection or correction or code with respect to said words of said first and second blocks with said redundant data;

separating said first predetermined number of words each comprised of said second predetermined number of said higher order bits of said respective digital data from each of said first blocks;

separating said first predetermined number of words each comprised of said third predetermined number of said lower order bits of said respective digital data from each of said second blocks; and combining respective higher order bits and respective lower order bit(s) so as to produce respective digital data each composed of said plurality of bits.

3. A method of processing digital data according to claim 1, comprising the steps of:

separating each of said respective address data units from each of said respective blocks each at said predetermined positions; and combining said two or more address data units so as to generate each of said respective address data.

4. The method according to claim 1, including the steps of recording the blocks in said sequence, and reproducing the blocks in said sequence, and instituting said original source data each composed of said plurality of bits from said reproduced blocks.

5. The method according to claim 1, including the steps of recording the blocks in said sequence, and reproducing the blocks in said sequence, and instituting said original source data each composed of said plurality of bits from said reproduced blocks.

* * * * *